United States Patent
Miyano

(10) Patent No.: US 9,715,923 B2
(45) Date of Patent: Jul. 25, 2017

(54) SEMICONDUCTOR MEMORY DEVICE AND METHOD FOR DRIVING THE SAME

(71) Applicant: Kabushiki Kaisha Toshiba, Minato-ku, Tokyo (JP)

(72) Inventor: Shinji Miyano, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/844,631

(22) Filed: Sep. 3, 2015

(65) Prior Publication Data

US 2016/0196870 A1    Jul. 7, 2016

(30) Foreign Application Priority Data

Jan. 7, 2015    (JP) ................................. 2015-001459

(51) Int. Cl.
| G11C 11/00 | (2006.01) |
| G11C 11/419 | (2006.01) |
| G11C 11/412 | (2006.01) |
| G11C 8/08 | (2006.01) |

(52) U.S. Cl.
CPC .......... *G11C 11/419* (2013.01); *G11C 11/412* (2013.01); *G11C 8/08* (2013.01)

(58) Field of Classification Search
CPC ........ G11C 11/419; G11C 11/412; G11C 8/08

USPC ......................................................... 365/154
See application file for complete search history.

(56) References Cited

U.S. PATENT DOCUMENTS

| 5,477,489 A | * | 12/1995 | Wiedmann | G11C 8/16 365/154 |
| 8,872,271 B2 | | 10/2014 | Hokazono | |
| 2014/0091396 A1 | * | 4/2014 | Hokazono | H01L 27/11 257/368 |

FOREIGN PATENT DOCUMENTS

JP       2014-072338 A    4/2014

* cited by examiner

*Primary Examiner* — Anthan Tran
(74) *Attorney, Agent, or Firm* — Knobbe, Martens, Olson & Bear, LLP

(57) ABSTRACT

A semiconductor memory device includes a first and a second TFET whose gates and drains are cross-coupled. The drain of the first TFET is connected to a first node. The drain of the second TFET is connected to a second node. Included are a first access transistor connecting the first node to a first write bit line, a second access transistor connecting the second node to a second write bit line, and a third access transistor connecting the first node to a first read bit line. The first access transistor is constructed of a TFET connected in such a manner as that current flows from the first node to the first write bit line upon turning-on. The second access transistor is constructed of a TFET connected in such a manner as that current flows from the second node to the second write bit line upon turning-on.

19 Claims, 8 Drawing Sheets

SEMICONDUCTOR MEMORY DEVICE AND METHOD FOR DRIVING THE SAME

CROSS-REFERENCE TO RELATED APPLICATIONS

This application is based upon and claims the benefit of priority from Japanese Patent Application No. 2015-001459, filed on Jan. 7, 2015; the entire contents of which are incorporated herein by reference.

FIELD

Embodiments described herein relate generally to a semiconductor memory device and a method for driving the same.

BACKGROUND

A technology is conventionally disclosed which fabricates SRAMs (Static Random Memory) with tunnel transistors. The tunnel transistor (TFET) can operate at low voltages. The SRAM does not originally require a refresh operation, but maintains a data holding state with a leak current flowing through a memory cell. A semiconductor memory device is desired which makes use of the characteristics of the tunnel transistor that can operate at low voltages and can reduce power consumption required to hold data.

DETAILED DESCRIPTION

In general, according to one embodiment, a semiconductor memory device includes: a first tunnel transistor and a second tunnel transistor whose gates and drains are cross-coupled; a first node connected to the drain of the first tunnel transistor; a second node connected to the drain of the second tunnel transistor; a first access transistor connecting the first node to a first write bit line; a second access transistor connecting the second node to a second write bit line; and a third access transistor connecting the first node to a first read bit line. The first access transistor is constructed of a tunnel transistor connected in such a manner as that current flows from the first node to the first write bit line upon turning-on in a forward biased state. The second access transistor is constructed of a tunnel transistor connected in such a manner as that current flows from the second node to the second write bit line upon turning-on in the forward biased state.

Exemplary embodiments of a semiconductor memory device and a method for driving the same will be explained below in detail with reference to the accompanying drawings. The present invention is not limited to the following embodiments.

First Embodiment

Figure 1:
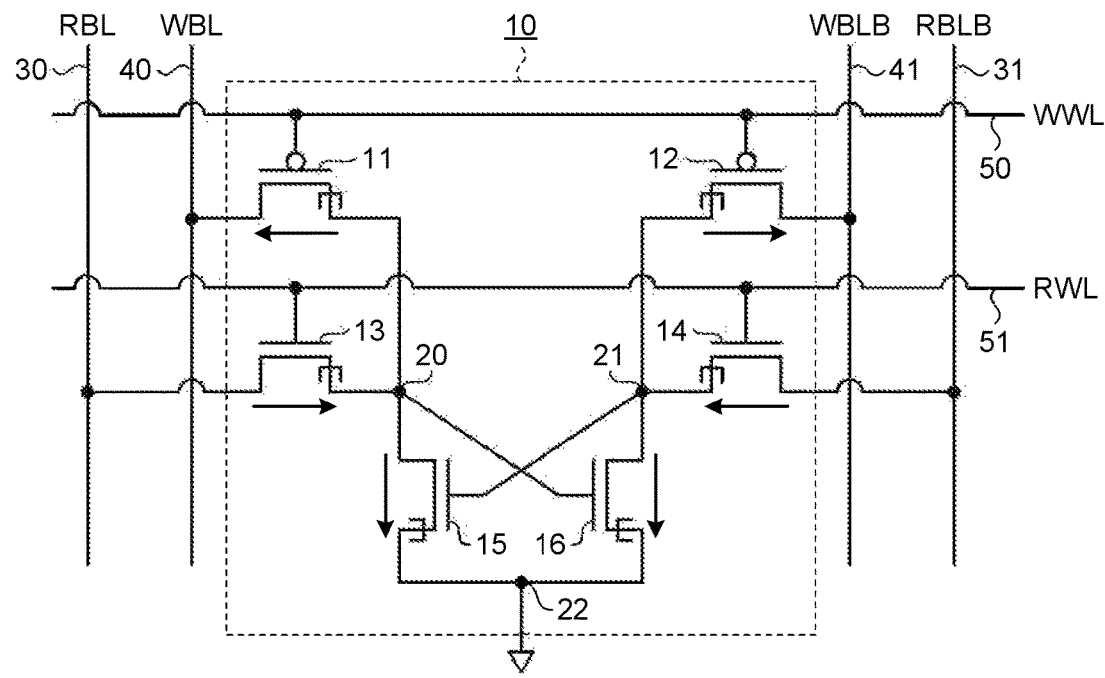
FIG. 1 is a diagram illustrating the configuration of a memory cell of a semiconductor memory device of a first embodiment.

FIG. 1 is a diagram illustrating the configuration of a memory cell of a semiconductor memory device of a first embodiment. A memory cell 10 of the semiconductor memory device of the embodiment includes an N-type tunnel transistor 15 and an N-type tunnel transistor 16. An N-type tunnel transistor is hereinafter expressed as an NTFET. A source of the NTFET 15 and a source of the NTFET 16 are commonly connected to a terminal 22. The terminal 22 is grounded. The NTFETs 15 and 16 include a P-type source region (not illustrated) and an N-type drain region (not illustrated). Hereinafter, a biased state where in an NTFET a voltage on the high potential side is applied to the N-type drain region and a voltage on the low potential side is applied to the source region is referred to as the forward biased state. The directions of currents flowing in the forward biased state are indicated with arrows. The same shall apply hereinafter. A gate of the NTFET 15 is connected to a drain of the NTFET 16. A gate of the NTFET 16 is connected to a drain of the NTFET 15. In other words, the gates and drains of the NTFETs 15 and 16 are cross-coupled.

The memory cell 10 of the embodiment includes an access transistor 13 constructed of an NTFET between the drain of the NTFET 15 and a first read bit line 30. A source-drain path being a main current path of the access transistor 13 is connected between the first read bit line 30 and a first node 20. The turning-on/off of the access transistor 13 constructed of an NTFET is controlled with a voltage applied to a read word line 51. An access transistor 14 constructed of an NTFET is similarly included between the drain of the NTFET 16 and a second read bit line 31. A source-drain path being a main current path of the access transistor 14 is connected between the second read bit line 31 and a second node 21. The turning-on/off of the access transistor 14 constructed of an NTFET is controlled with a voltage applied to the read word line 51.

The memory cell 10 of the embodiment includes an access transistor 11 constructed of a P-type tunnel transistor between the drain of the NTFET 15 and a first write bit line 40. A source-drain path being a main current path of the access transistor 11 is connected between the first write bit line 40 and the first node 20. An access transistor 12 constructed of a P-type tunnel transistor is similarly included between the drain of the NTFET 16 and a second write bit line 41. A source-drain path being a main current path of the access transistor 12 is connected between the second write bit line 41 and the second node 21. A P-type tunnel transistor is hereinafter expressed as a PTFET. The PTFETs 11 and 12 include an N-type source region (not illustrated) and a P-type drain region (not illustrated). A biased state where in a PTFET a voltage on the high potential side is applied to the N-type source region and a voltage on the low potential side is applied to the drain region is hereinafter referred to as the forward biased state. The directions of currents flowing in the forward biased state are indicated with arrows. The same shall apply hereinafter. The turning-on/off of the access transistor (11, 12) constructed of a PTFET is controlled with a voltage applied to a write word line 50.

In the embodiment, the memory cell 10 is configured only of TFETs. Therefore, operation at low voltages is possible.

Figure 2:
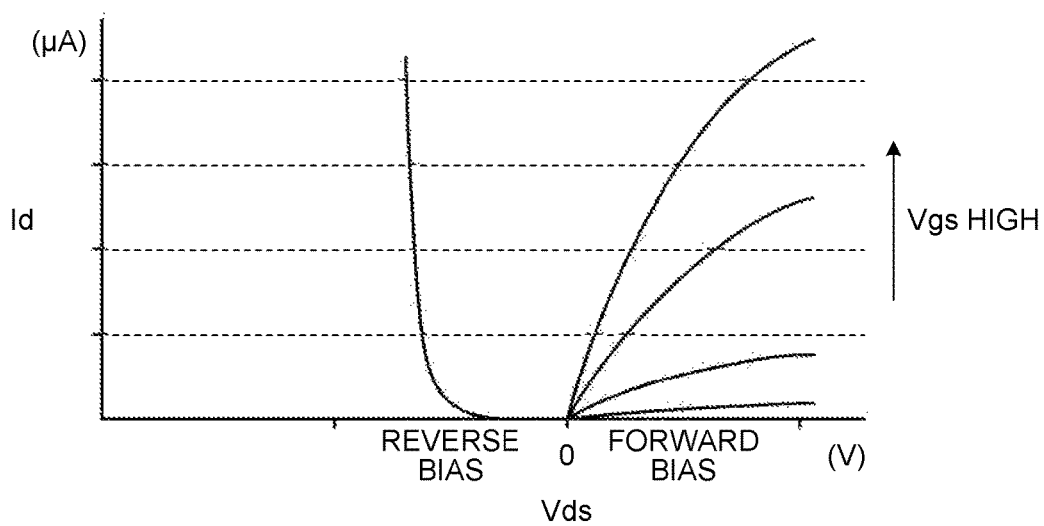
FIG. 2 is a diagram for illustrating the operating characteristics of a tunnel transistor.

FIG. 2 is a diagram illustrating the operating characteristics of the TFET. The operating characteristics of the NTFET are given as one example. The horizontal axis of FIG. 2 indicates voltage Vds to be applied between the source and drain of the NTFET. The vertical axis of FIG. 2 indicates drain current Id. In the forward biased state, the voltage Vgs between the gate and the source is increased to increase the drain current Id. On the other hand, in the forward biased state, there is a characteristic that the current flowing between the source and the drain is small when the voltage Vgs between the gate and the source is zero. The NTFET has the characteristic that the leak current is small in the forward biased state. The characteristic that the leak current is small in the forward biased state holds true for the PTFET. In the reverse biased state, the drain current Id dramatically increases when exceeding a predetermined threshold value. This is because that a diode (not illustrated) formed by the NTFET is biased and, accordingly a current in the opposite direction to that of the drain current in the forward biased state flows due to the forward characteristics of the diode. The direction of the current by the diode is opposite to that of the drain current Id. However, for convenience of description, it is illustrated in the same direction as that of the drain current Id of the NTFET in the forward biased state.

Figure 3:
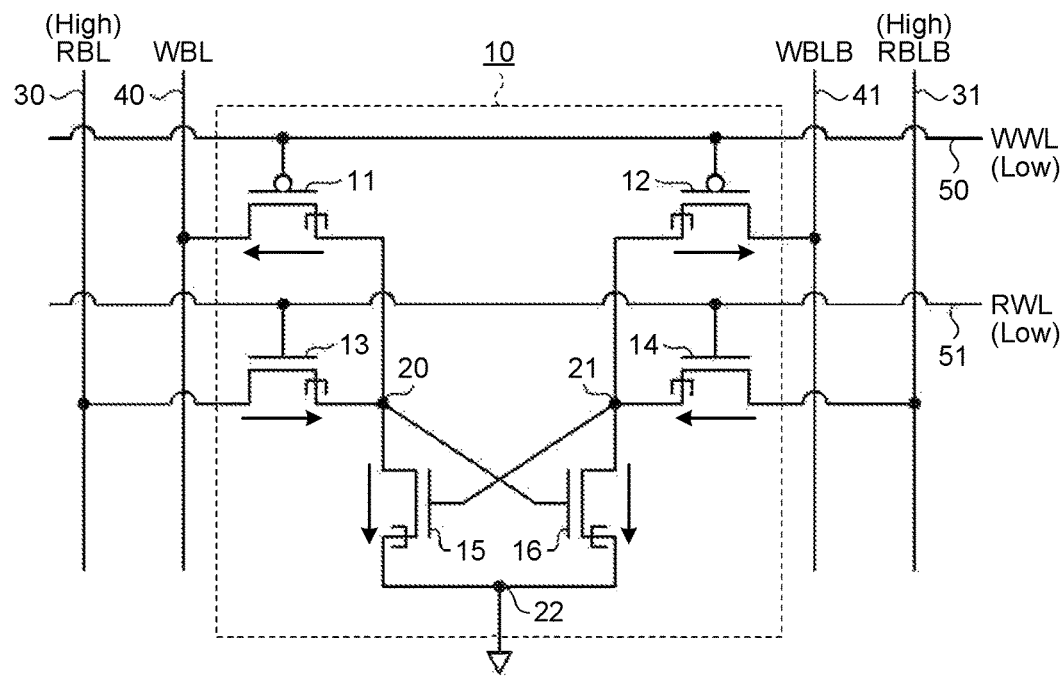
FIG. 3 is a diagram for illustrating a write operation.

Hereinafter, a description is given of a method for operating the semiconductor memory device with reference to the drawings. Firstly, a write operation is described with reference to FIG. 3. In the write operation, for example, a ground potential VSS is applied to the read word line 51. The ground potential VSS is applied to the read word line 51 to turn off the access transistors (13 and 14) whose gates are connected to the read word line 51. A High-level potential, for example, a power supply voltage VDD on the high potential side, is applied to the read bit lines (30 and 31). Consequently, the access transistors (13 and 14) constructed of an NTFET enter the forward biased state where the High-level voltage is applied to the drain. In other words, the access transistors (13 and 14) are maintained in the low leak state.

A Low-level voltage, for example, the ground potential VSS, is applied to the write word line 50. The Low-level voltage is applied to the write word line 50 to turn on the access transistors 11 and 12 whose gates are connected to the write word line 50. Consequently, if, for example, the potential of the first write bit line 40 is at Low level in a state where the first node 20 is holding data at High level, the conduction of the access transistor 11 reduces the potential of the first node 20 to Low level. Consequently, data at Low level can be written into the first node 20. The first node 20 becomes Low level and accordingly the NTFET 16 is turned off and the second node 21 becomes High level. In other words, the access transistors (11 and 12) are turned on and accordingly data of the write bit lines (40 and 41) can be written into the memory cell 10.

Figure 4:
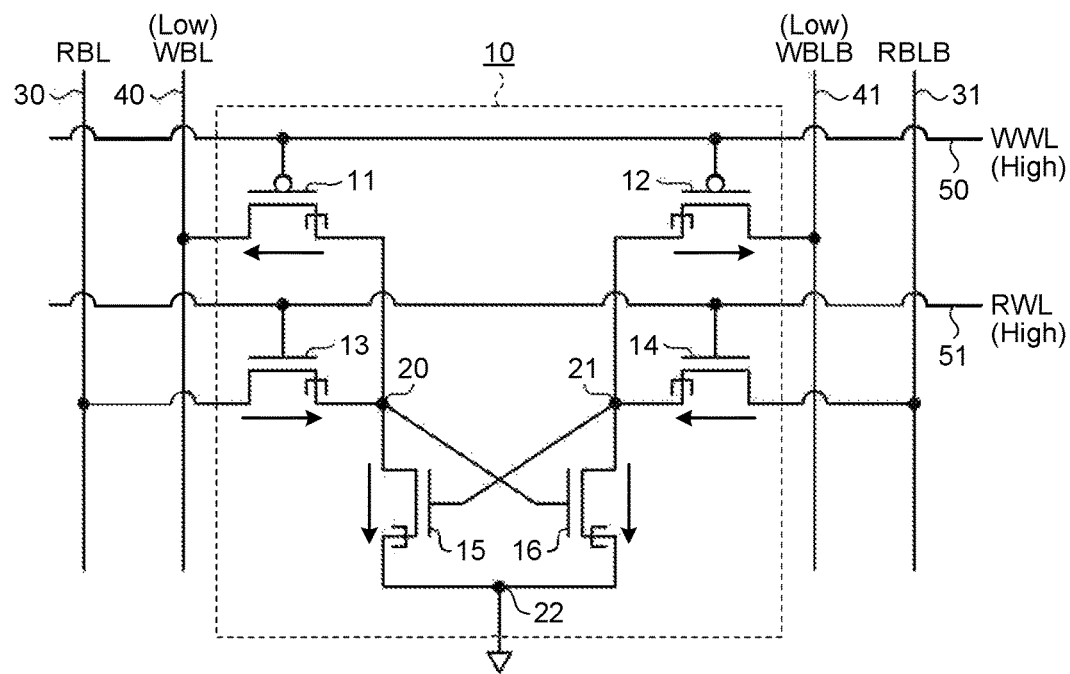
FIG. 4 is a diagram for illustrating a read operation.

Next, a read operation is described with reference to FIG. 4. In the read operation, a High-level voltage, for example, the power supply voltage VDD on the high potential side, is applied to the write word line 50. Consequently, the access transistors (11 and 12), the gates of which are connected to the write word line 50, are turned off. A Low-level voltage, for example, the ground potential VSS, is applied to the write bit lines (40 and 41). Consequently, the access transistors (11 and 12) constructed of a PTFET enter the forward biased state where the Low-level voltage is applied to the drain. In other words, the access transistors (11 and 12) are maintained in the low leak state.

A High-level voltage, for example, the power supply voltage VDD, is applied to the read word line 51. Consequently, the access transistors (13 and 14), the gates of which are connected to the read word line 51, are turned on. Consequently, if, for example, data at Low level is held in the second node 21 and data at High level is held in the first node 20, the turning-on of the access transistor 14 reduces the potential of the second read bit line 31. The potential of the second read bit line 31 becomes Low level. On the other hand, the first read bit line 30 stays in High level. A potential difference between the first read bit line 30 and the second read bit line 31 is detected by a sense amplifier (not illustrated) to enable the reading of data written in the memory cell 10.

Figure 5:
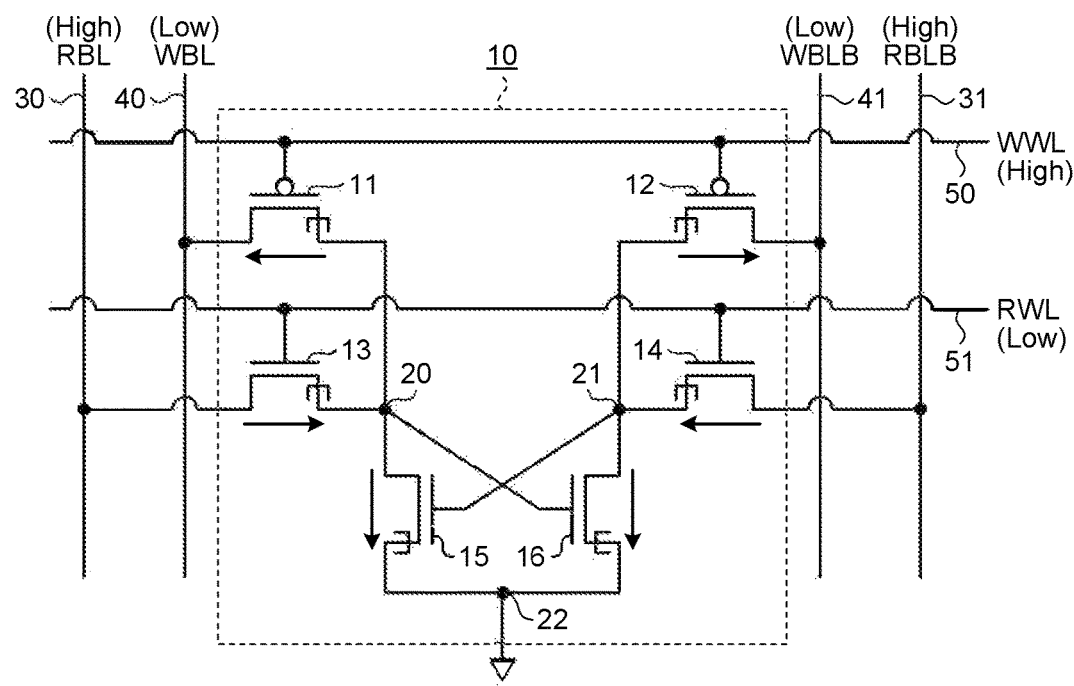
FIG. 5 is a diagram for illustrating a retention operation.

Next, the holding of data, in other words, a retention operation, is described with reference to FIG. 5. In the retention operation, a High-level voltage, for example, the power supply voltage VDD, is applied to the write word line 50. The High-level voltage is applied to the write word line 50 to turn off the access transistors (11 and 12) whose gates are connected to the write word line 50.

In the retention operation, a Low-level voltage, for example, the ground potential VSS, is applied to the read word line 51. The Low-level voltage is applied to the read word line 51 to turn off the access transistors (13 and 14) whose gates are connected to the read word line 51.

A Low-level voltage, for example, the ground potential VSS, is applied to the first write bit line 40 and the second write bit line 41. Consequently, the access transistors (11 and 12) constructed of a PTFET enter the forward biased state where the Low-level voltage is applied to the source, and are accordingly maintained in the low leak state. Consequently, the leak current upon retention can be reduced.

A High-level voltage, for example, the power supply voltage VDD, is applied to the first read bit line 30 and the second read bit line 31. Consequently, the High-level voltage is applied to the drains of the access transistors (13 and 14) constructed of an NTFET. The access transistors (13 and 14) then enter the forward biased state, and are maintained in the low leak state. In other words, in the retention operation, the access transistors (11, 12, 13 and 14) are forced into the forward biased state and accordingly the leak current can be reduced. Therefore, data can be held in the low leak state.

Figure 6:
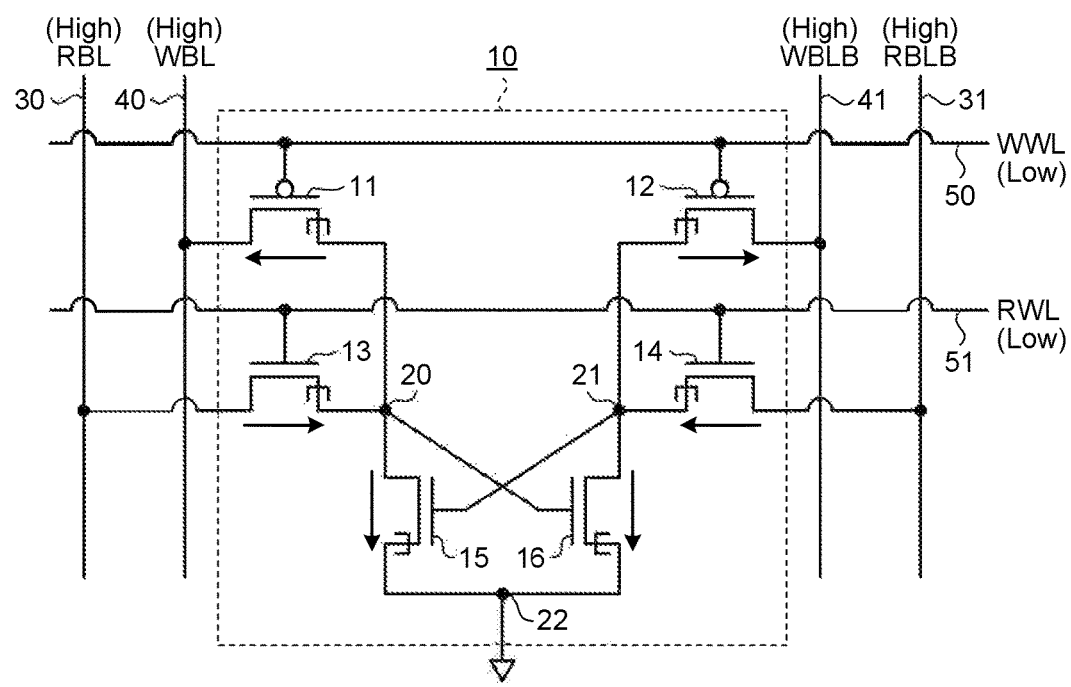
FIG. 6 is a diagram for illustrating a refresh operation.

Next, a refresh operation is described with reference to FIG. 6. The refresh operation is an operation for preventing data of the memory cell 10 from being lost if, for example, the retention state continues. In the refresh operation, a Low-level voltage, for example, the ground potential VSS, is applied to the write word line 50, and a High-level voltage is applied to the first write bit line 40 and the second write bit line 41. For example, the power supply voltage VDD is applied as the High-level voltage. The High-level voltage is applied to the first write bit line 40 and the second write bit line 41. Accordingly, a reverse-bias voltage is applied or formed between the sources and drains of the access transistors 11 and 12 constructed of a PTFET. The reverse-bias voltage is applied to forward bias a diode (not illustrated) constructed of a P-type drain region (not illustrated) and an N-type source region (not illustrated) of the access transistor (11, 12). If the voltage to bias the diode exceeds a threshold value that turns on the diode, currents due to the forward characteristic of the diodes flows from the drain of the access transistor 11 to the first node 20, and flows from the drain of the access transistor 12 to the second node 21.

For example, if the first node 20 is holding data at High level, and the second node 21 is holding data at Low level, the NTFET 16 is in the on state and the NTFET 15 is in the off state. Currents from the access transistors 11 and 12 flow through the first node 20 and the second node 21. Accordingly, the potential of the first node 20 to which the drain of the NTFET 15 in the off state is connected increases while the potential of the second node 21 to which the drain of the NTFET 16 in the on state is connected decreases. Consequently, the data held by the memory cell 10 can be refreshed.

The refresh operation can be performed on all the memory cells 10 at once by simply applying a High-level voltage to the write bit lines (40 and 41) while maintaining the potential of the write word line 50 at Low level. Therefore, the operation of increasing/decreasing the voltage of the write word line 50, or increasing/decreasing the voltage of the write bit lines (40 and 41), with the refresh operation becomes unnecessary. Accordingly, power consumption in the refresh operation can be reduced.

According to the configuration of the memory cell of the semiconductor memory device of the embodiment, the write operation is performed through the access transistor 11 constructed of a PTFET connected in such a manner as that the drain current flows from the first node 20 to the first write bit line 40 upon turning-on, and the access transistor 12 similarly constructed of a PTFET connected in such a manner as that the drain current flows from the second node 21 to the second write bit line 41 upon turning-on. Consequently, the write operation can be performed by the access transistors in the forward biased state.

The read operation is performed through the access transistor 13 constructed of an NTFET connected in such a manner as that the drain current flows from the first read bit line 30 to the first node 20 upon turning-on, and the access transistor 14 similarly constructed of an NTFET connected in such a manner as that the drain current flows from the second read bit line 31 to the second node 21 upon turning-on. In other words, the read operation can be performed using the access transistors in the forward biased state.

Moreover, upon retention, the access transistors (11, 12, 13, and 14) are maintained in the forward biased state. Accordingly, data can be held in the low leak state. Furthermore, the refresh operation can be performed without increasing/decreasing the voltage of the write word line 50. Accordingly, power consumption in the refresh operation can be reduced.

According to the embodiment, it is configured in such a manner as that the write operation is performed by the access transistors (11 and 12) that operate in the forward biased state, and the read operation is performed by the access transistors (13 and 14) that operate in the forward biased state. Accordingly, the semiconductor memory device that reduces power consumption is provided. The semiconductor memory device can be provided in which the write and read operations are performed through the access transistors (11, 12, 13, and 14) provided individually and exclusively and, accordingly, the control performance of the write and read operations can be improved and the refresh operation can be performed on all the memory cells 10 at once.

Second Embodiment

Figure 7:
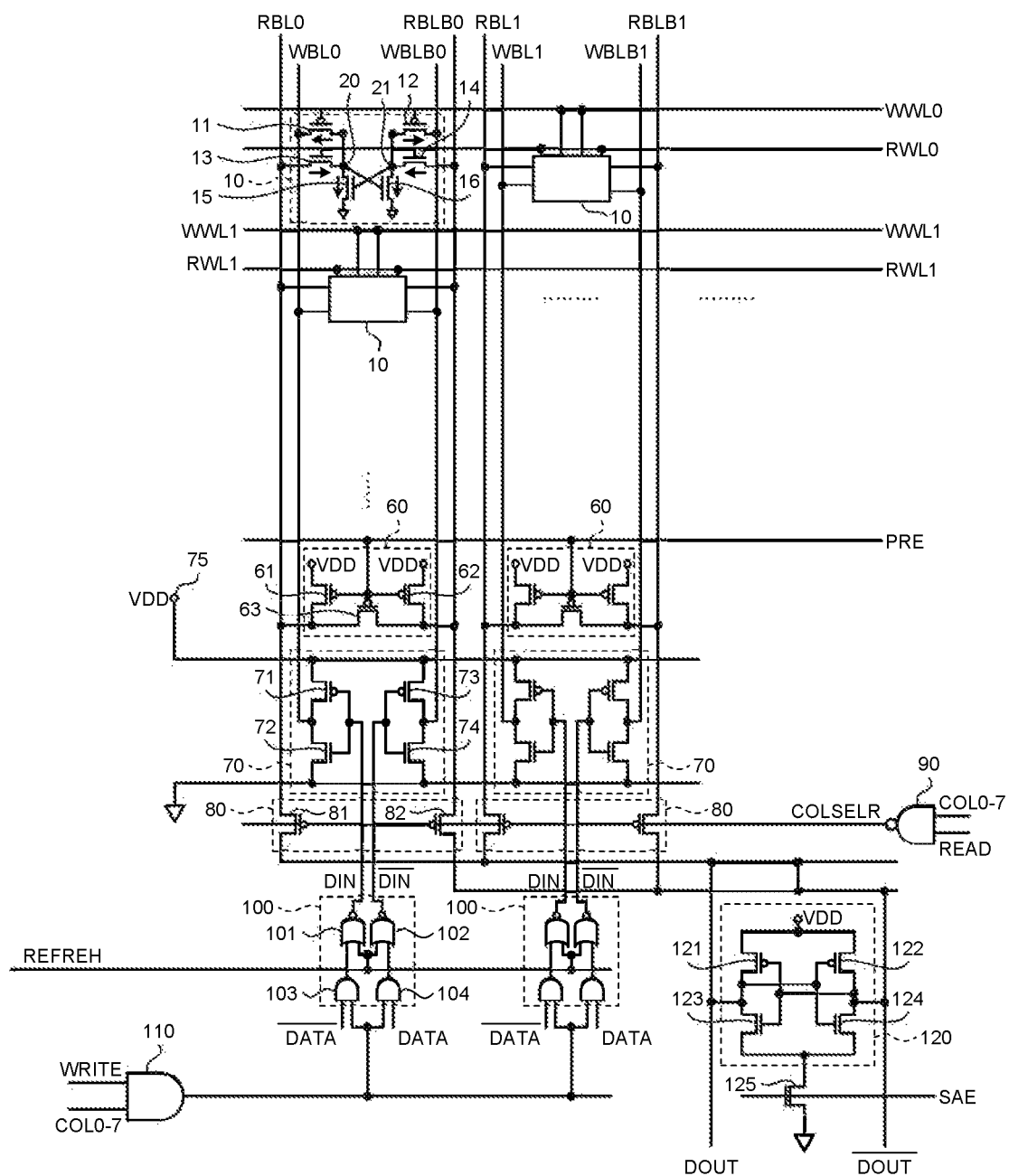
FIG. 7 is a diagram illustrating a system configuration of a semiconductor memory device of a second embodiment.

FIG. 7 is a diagram illustrating a system configuration of a semiconductor memory device of a second embodiment. The same reference numerals are assigned to components corresponding to those of the above-described embodiment. The semiconductor memory device of the embodiment includes a plurality of write word lines (WWL0 and WWL1) and a plurality of read word lines (RWL0 and RWL1). The write word lines (WWL0 and WWL1) are connected to a write column decoder (not illustrated). The voltage that turns on the access transistors (11 and 12) is applied to the write word line (WWL0, WWL1) upon the write operation. The read word lines (RWL0 and RWL1) are connected to a read column decoder (not illustrated). The voltage that turns on the access transistors (13 and 14) is applied to the read word line (RWL0, RWL1) upon the read operation.

The semiconductor memory device of the embodiment includes a plurality of first write bit lines (WBL0 and WBL1) and a plurality of second write bit lines (WBLB0 and WBLB1). The semiconductor memory device similarly includes a plurality of first read bit lines (RBL0 and RBL1) and a plurality of second read bit lines (RBLB0 and RBLB1). The memory cell 10 is connected to the first write bit line (WBL0, WBL1) and the second write bit line (WBLB0, WBLB1), and the first read bit line (RBL0, RBL1) and the second read bit line (RBLB0, RBLB1), and the write word line (WWL0, WWL1) and the read word line (RWL0, RWL1).

The semiconductor memory device of the embodiment includes a precharge equalizer circuit 60. The precharge equalizer circuit 60 responds to a precharge signal PRE. The precharge equalizer circuit 60 includes three PMOS transistors (61, 62 and 63).

The semiconductor memory device of the embodiment includes a write circuit 70. The write circuit 70 includes transistors (71 and 72) configuring an inverter and transistors (73 and 74) similarly configuring an inverter. The power supply voltage VDD applied to a terminal 75 is applied as a bias voltage of the write circuit 70. Input data (DIN and /DIN) is supplied to the write circuit 70 via a gate circuit 100.

The gate circuit 100 includes two NOR circuits (101 and 102). The outputs of AND circuits (103 and 104) and a refresh control signal REFREH are supplied to the NOR circuits (101 and 102). The input data /DATA and an output signal of an AND circuit 110 are supplied to the AND circuit 103. The input data DATA and an output signal of the AND circuit 110 are supplied to the AND circuit 104. A write control signal WRITE and a column selection signal COL0-7 are supplied to the AND circuit 110.

The semiconductor memory device of the embodiment includes a read circuit 80. The read circuit 80 includes two PMOS transistors (81 and 82) The read circuit 80 responds to a read signal COLSELR supplied from a NAND circuit 90 and connects the first read bit line (RBL0, RBL1) and the second read bit line (RBLB0, RBLB1) to the sense amplifier 120. A read control signal READ and the column selection signal COL0-7 are supplied to the NAND circuit 90.

The sense amplifier 120 includes PMOS transistors (121 and 122) and NMOS transistors (123 and 124). A sense amplifier control signal SAE is supplied to a gate of an NMOS transistor 125 connected between the sense amplifier 120 and the ground potential VSS. The turning-on/off of the NMOS transistor 125 is controlled with the sense amplifier control signal SAE to control the sense amplifier 120. A signal amplified by the sense amplifier 120 is output as an output signal (DOUT, /DOUT).

In the semiconductor memory device of the embodiment, the write circuit 70 applies the power supply voltage VDD to the first write bit lines (WBL0 and WBL1) and the second write bit lines (WBLB0 and WBLB1) in response to the refresh control signal REFREH. Consequently, with the above-described operation, currents flow from the first write bit lines (WBL0 and WBL1) and the second write bit lines (WBLB0 and WBLB1) to the first nodes 20 and the second nodes 21 of the memory cells 10 through the access transistors (11 and 12) connected to the write bit lines. Therefore, the refresh operation is performed on all the memory cells 10 at once. In the refresh operation, a High-level voltage, for example, the power supply voltage VDD, continues to be applied to the write word lines (WWL0 and WWL1). Accordingly, the increase of power consumption with the increase/decrease of the voltage of the write word lines (WWL0 and WWL1) can be reduced.

Figure 8:
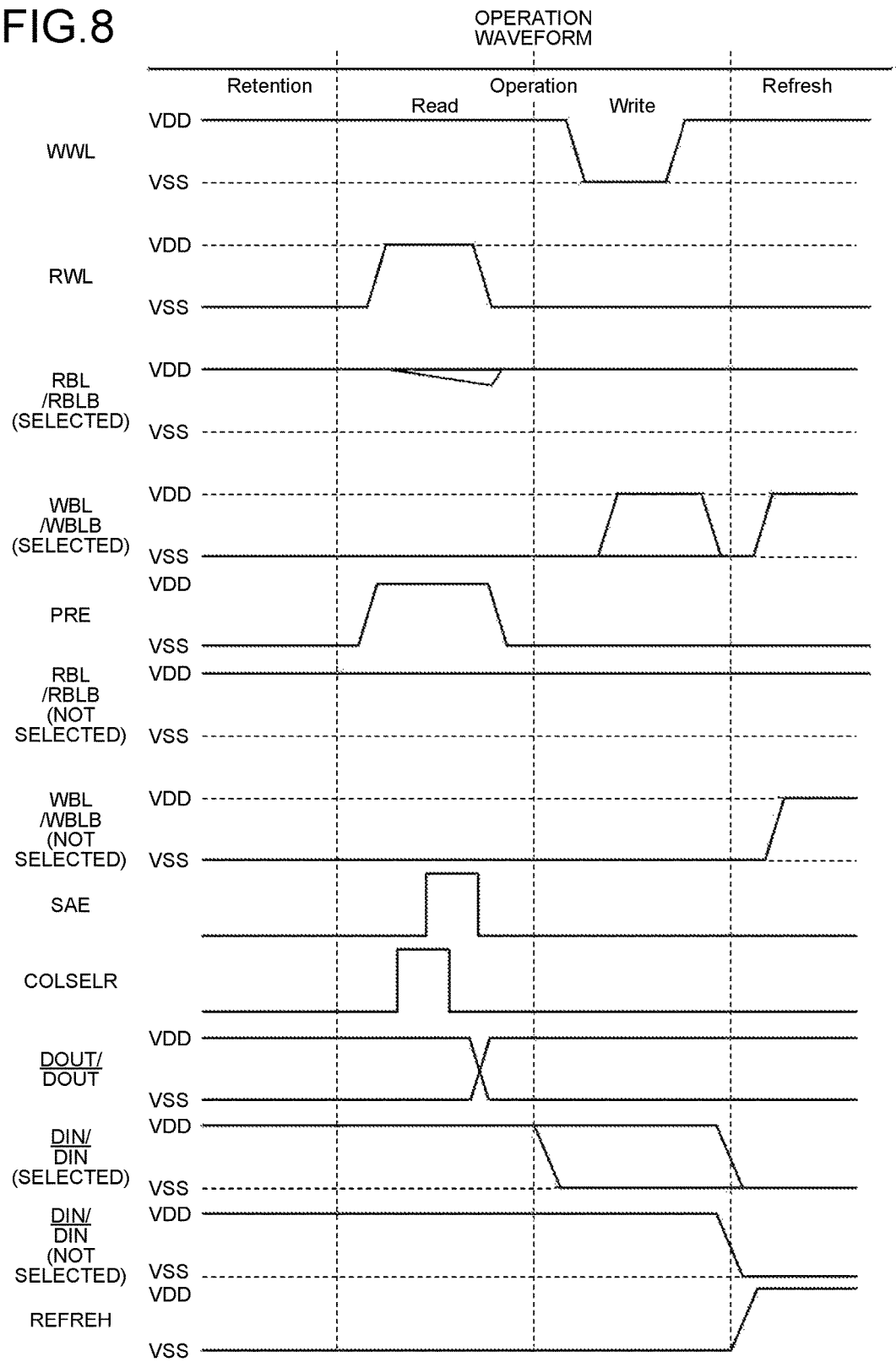
FIG. 8 is a diagram illustrating a timing chart of a method for driving the semiconductor memory device of the second embodiment.

FIG. 8 is a diagram illustrating a timing chart of a method for driving the semiconductor memory device of the second embodiment. Upon retention Retention, the power supply voltage VDD being a High-level voltage is applied to the write word line WWL. Consequently, the access transistors (11 and 12) for writing connected to the write word line WWL are turned off. The ground potential VSS being a Low-level voltage is applied to the read word line RWL. Consequently, the access transistors (13 and 14) for reading are turned off.

In the read operation in the operating state Operation, the power supply voltage VDD being a High-level voltage is applied to the read word line RWL. Consequently, the access transistors (13 and 14) connected to the selected read word line RWL are turned on. Data of the selected read bit lines (RBL and /RBLB) (selected) are read. Upon the read operation, the precharge equalizer control signal PRE is at High level. The read signal COLSELR and the sense amplifier control signal SAE are supplied. With the operation of the sense amplifier 120 in response to the sense amplifier control signal SAE, the output signals (DOUT and /DOUT) are output.

In the write operation Write, the ground potential VSS at Low level is applied to the write word line WWL. Consequently, the access transistors (11 and 12) for writing connected to the selected write word line WWL are turned on. The ground potential VSS being a Low-level voltage is applied to the read word line RWL. Consequently, the access transistors (13 and 14) for reading are turned off. Input data (DIN and /DIN) is written into the memory cell 10 connected to the selected write bit lines (WBL and /WBLB) (selected).

In the refresh operation Refresh, the refresh control signal REFREH becomes High level. In the refresh operation Refresh, the write control signal WRITE is at Low level. Accordingly, a Low-level signal is output from the AND circuit 110 and supplied to the gate circuit 100. Consequently, the Low-level signals are supplied from the gate circuit 100 to the write circuit 70. Consequently, the PMOS transistors (71 and 73) of the write circuit 70 are turned on. Accordingly, the power supply voltage VDD is supplied to the first write bit line (WBL0, WBL1) and the second write bit line (WBLB0, WBLB1). Consequently, the refresh operation can be performed by the above-described operation on all the memory cells 10 at once while the potential of the write word line 50 is maintained at Low level.

Third Embodiment

Figure 9:
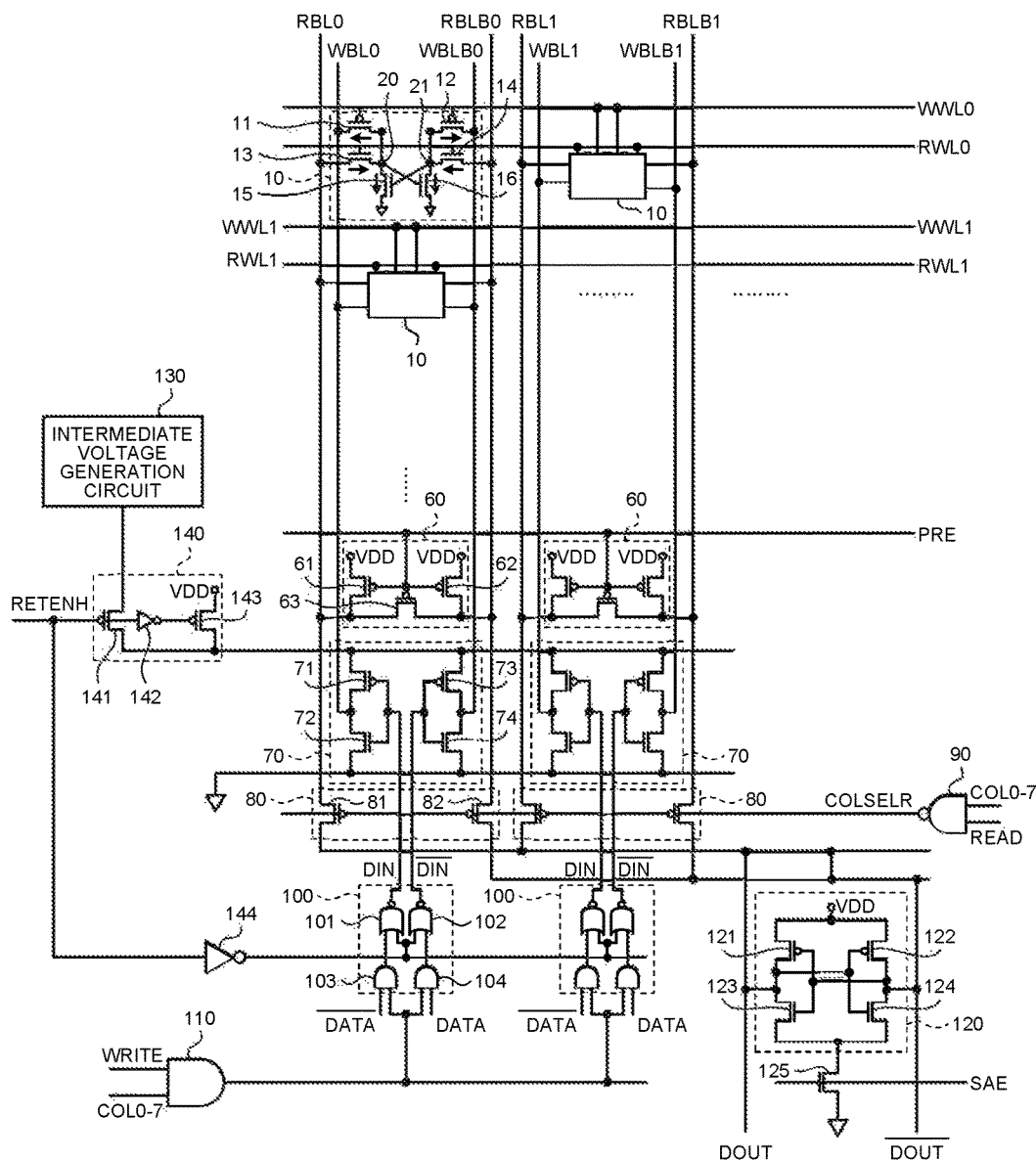
FIG. 9 is a diagram illustrating a system configuration of a semiconductor memory device of a third embodiment.

FIG. 9 is a diagram illustrating a system configuration of a semiconductor memory device of a third embodiment. The same reference numerals are assigned to components corresponding to those of the above-described embodiments. The overlapping descriptions are given only when necessary. The embodiment includes a voltage switching circuit 140. The voltage switching circuit 140 includes PMOS transistors 141 and 143. A retention control signal RETENH is supplied to a gate of the PMOS transistor 141. The retention control signal RETENH is supplied to a gate of the PMOS transistor 143 via an inverter 142. The retention control signal RETENH is supplied to the NOR circuits (101 and 102) of the gate circuit 100 via an inverter 144.

The PMOS transistor 141 is connected to an intermediate voltage generation circuit 130. The intermediate voltage generation circuit 130 generates, for example, an intermediate voltage VM between the power supply voltage VDD and the ground potential VSS. The intermediate voltage VM is set to a voltage to the degree that the diode (not illustrated) formed between the source and drain of the TFET constructing the access transistor (11, 12) is not turned on. In the retention state, the intermediate voltage VM is applied to the first write bit line (WBL0, WBL1) and the second write bit line (WBLB0, WBLB1). Consequently, data of the memory cell 10 is held with the leak current of the access transistor (11, 12).

Figure 10:
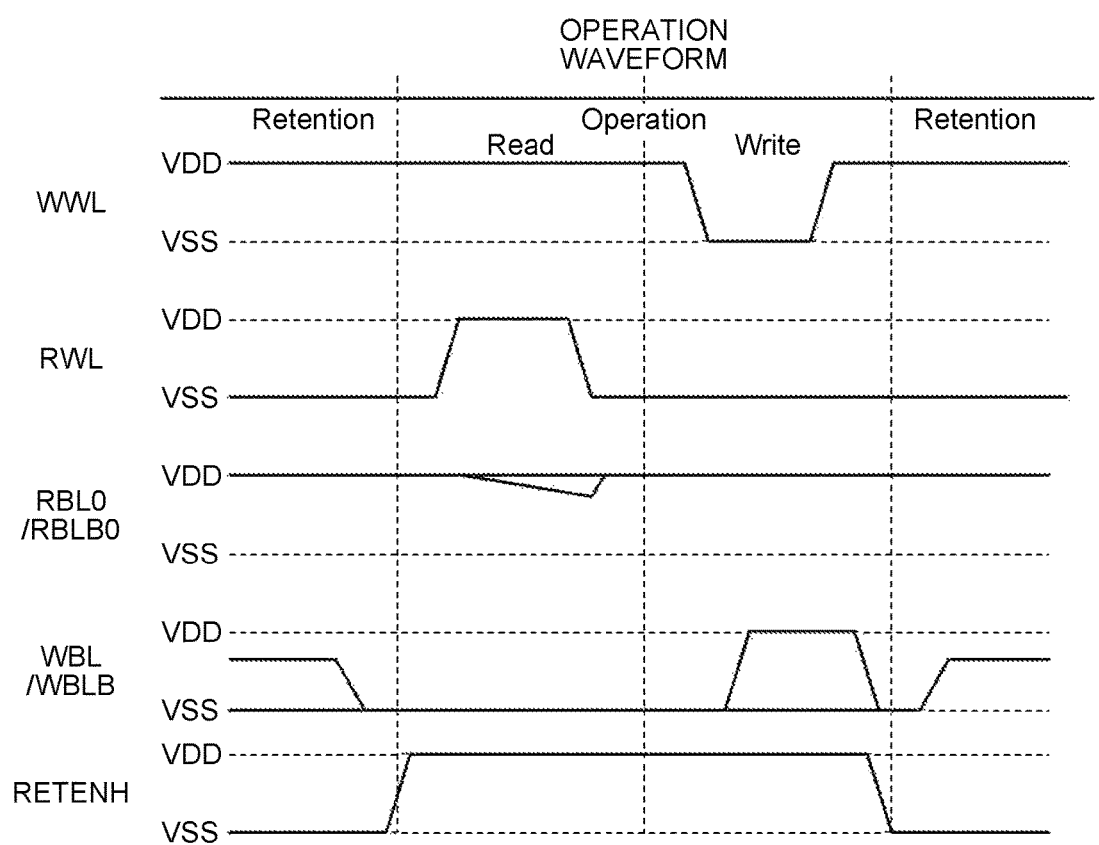
FIG. 10 is a diagram illustrating a timing chart of a method for driving the semiconductor memory device of the third embodiment.

The driving method of the embodiment is described with reference to the timing chart of FIG. 10. The retention operation Retention is described to avoid the overlapping description with the timing chart of FIG. 8. In the driving method of the embodiment, in the retention operation Retention, the retention control signal RETENH is at Low level. The PMOS transistor 141 of the voltage switching circuit 140 is turned on, and the intermediate voltage VM of the intermediate voltage generation circuit 130 is supplied to the write bit lines (WBL and WBLB). Consequently, if, for example, the first node 20 is holding Low-level data, the access transistor 11 connected between the first node 20 and the write bit line enters the reverse biased state. Consequently, the leak current of the access transistor 11 flows toward the node 20. The data can be held with the leak current of the access transistor 11.

Fourth Embodiment

Figure 11:
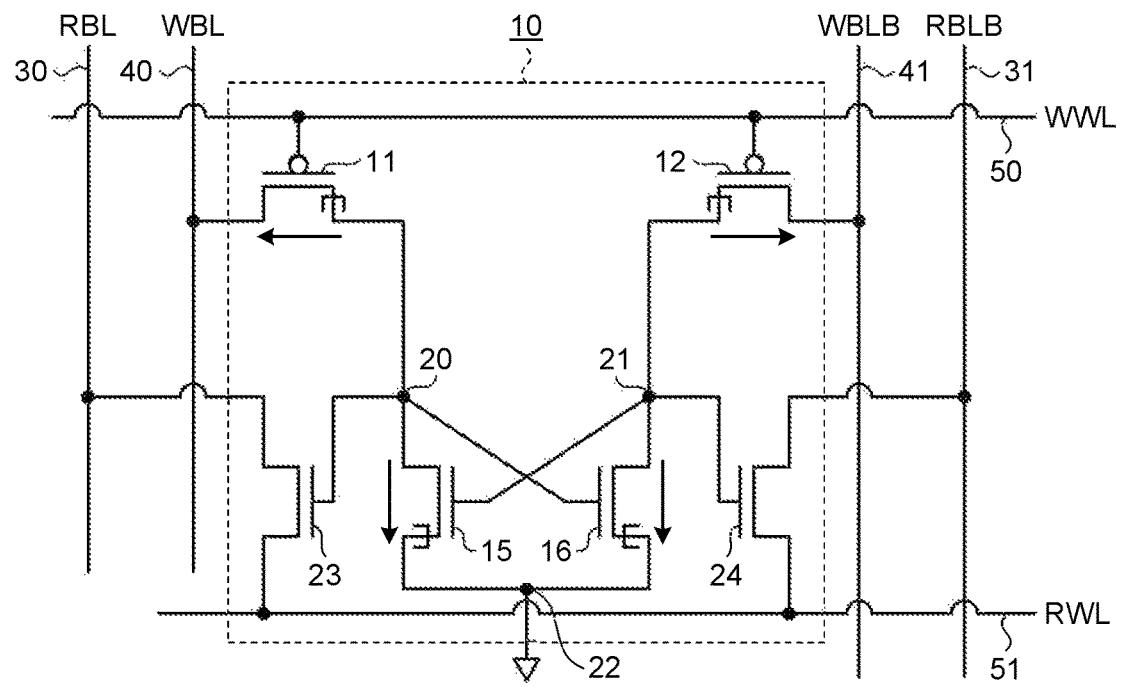
FIG. 11 is a diagram illustrating the configuration of a memory cell of a semiconductor memory device of a fourth embodiment.

FIG. 11 is a diagram illustrating the configuration of a memory cell of a semiconductor memory device of a fourth embodiment. The same reference numerals are assigned to components corresponding to those of the above-described embodiments. The memory cell 10 of the embodiment includes an NMOS transistor 23 having a source connected to the read word line 51, and a gate connected to the first node 20. A drain of the NMOS transistor 23 is connected to the first read bit line 30. The NMOS transistor 23 responds to a voltage applied to the read word line 51, and supplies a voltage in accordance with the voltage of the first node 20 to the first read bit line 30.

The memory cell 10 of the semiconductor memory device of the embodiment includes an NMOS transistor 24 having a source impressed by the read word line 51, and a gate connected to the second node 21. A drain of the NMOS transistor 24 is connected to the second read bit line 31. The NMOS transistor 24 responds to a voltage applied to the read word line 51, and supplies a voltage in accordance with the voltage of the second node 21 to the second read bit line 31.

The memory cell 10 of the embodiment performs the read operation with the NMOS transistors (23 and 24). The NMOS transistors (23 and 24) have high drive performance compared with TFET. Since the data read operation is performed with the NMOS transistors (23 and 24) having high drive performance, speedups in the read operation of the semiconductor memory device can be promoted.

In the above-described embodiments, the first tunnel transistor 15 and the second tunnel transistor 16 whose gates and drains are cross-coupled are constructed of an NTFET, but may be constructed of a PTFET. In this case, the power supply voltage VDD on the high potential side is applied to the terminal 22 to which the sources of the PTFETs are commonly connected. Moreover, it may be configured including only the first read bit line 30 instead of including a pair of read bit lines, in other words, the first read bit line 30 and the second read bit line 31.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first tunnel transistor and a second tunnel transistor whose gates and drains are cross-coupled;
   a first node connected to the drain of the first tunnel transistor;
   a second node connected to the drain of the second tunnel transistor;
   a first access transistor connecting the first node to a first write bit line;
   a second access transistor connecting the second node to a second write bit line; and
   a third access transistor that supplies a voltage corresponding to a voltage of the first node to a first read bit line, wherein
   the first access transistor is constructed of a tunnel transistor connected in such a manner as that current flows from the first node to the first write bit line upon turning-on in a forward biased state,
   the second access transistor is constructed of a tunnel transistor connected in such a manner as that current flows from the second node to the second write bit line upon turning-on in a forward biased state, and
   the semiconductor memory device further comprises a voltage supply circuit that supplies a voltage to the first and second write bit lines to apply reverse-bias voltages based on the voltage between sources and drains of the first and second access transistors in response to a refresh control signal upon a refresh operation.

2. The semiconductor memory device according to claim 1, further comprising a fourth access transistor that supplies a voltage corresponding to a voltage of the second node to a second read bit line.

3. The semiconductor memory device according to claim 1, wherein the third access transistor is constructed of a tunnel transistor connected in such a manner as that current flows from the first read bit line to the first node upon turning-on in a forward biased state.

4. The semiconductor memory device according to claim 2, wherein the third access transistor is constructed of a tunnel transistor connected in such a manner as that current flows from the first read bit line to the first node upon turning-on in a forward biased state.

5. The semiconductor memory device according to claim 2, wherein
   the first and second tunnel transistors and the third and fourth access transistors are N-type tunnel transistors, and
   the first and second access transistors are P-type tunnel transistors.

6. The semiconductor memory device according to claim 1, wherein the third access transistor includes a MOS transistor.

7. The semiconductor memory device according to claim 2, wherein the third and fourth access transistors are NMOS transistors.

8. The semiconductor memory device according to claim 1, wherein the third access transistor includes an NMOS transistor that has a gate connected to the first node, a source connected to a read word line and a drain connected to the first read bit line.

9. The semiconductor memory device according to claim 1, wherein the voltage supply circuit supplies a power supply voltage on a high potential side to the first and second write bit lines in response to the refresh control signal.

10. The semiconductor memory device according to claim 1, further comprising an intermediate voltage supply circuit that supplies a preset voltage between a power supply voltage on a high potential side and a ground potential to the first and second write bit lines upon a retention.

11. A method for driving a semiconductor memory device including
    a first tunnel transistor and a second tunnel transistor whose gates and drains are cross-coupled,
    a first node connected to the drain of the first tunnel transistor,
    a second node connected to the drain of the second tunnel transistor,
    a first access transistor whose main current path is connected between the first node and a first write bit line, the turning-on/off of which is controlled with a voltage applied to a write word line, and
    a second access transistor whose main current path is connected between the second node and a second write bit line, the turning-on/off of which is controlled with a voltage applied to the write word line, in which
    the first access transistor is constructed of a tunnel transistor connected in such a manner as that current flows from the first node to the first write bit line upon turning-on in a forward biased state, and
    the second access transistor is constructed of a tunnel transistor connected in such a manner as that current flows from the second node to the second write bit line upon turning-on in a forward biased state,
    the method for driving the semiconductor memory device, comprising, upon a refresh operation, applying a voltage that turns off the first and second access transistors to the write word line, and applying a voltage to the first and second write bit lines to form reverse-bias between sources and drains of the first and second access transistors.

12. The method for driving the semiconductor memory device according to claim 11, wherein the first and second access transistors include P-type tunnel transistors, and wherein the applying the voltage to the first and second write bit lines includes, upon the refresh operation, applying a power supply voltage on a high potential side to the first and second write bit lines.

13. The method for driving the semiconductor memory device according to claim 11, wherein the semiconductor memory device further including:
- a third access transistor whose main current path is connected between the first node and a first read bit line, and whose gate is connected to a read word line; and
- a fourth access transistor whose main current path is connected between the second node and a second read bit line, and whose gate is connected to the read word line, wherein the method for driving the semiconductor memory device, further comprising applying a voltage to turn on the third and fourth access transistors to the read word line upon a read operation.

14. The method for driving the semiconductor memory device according to claim 11, wherein the semiconductor memory device further including:
- a third access transistor whose main current path is connected between a first read bit line and a read word line, and whose gate is connected to the first node; and
- a fourth access transistor whose main current path is connected between a second read bit line and the read word line, and whose gate is connected to the second node, wherein the method for driving the semiconductor memory device, upon a read operation, further comprising:
turning on/off the third access transistor according to a voltage of the first node; and
turning on/off the fourth access transistors according to a voltage of the second node.

15. The method for driving the semiconductor memory device according to claim 11, wherein
the first and second tunnel transistors include N-type tunnel transistors, and the first and second access transistors include P-type tunnel transistors, and
the applying the voltage to the first and second write bit lines includes applying a power supply voltage on a high potential side to the first and second write bit lines upon the refresh operation.

16. The method for driving the semiconductor memory device according to claim 14, wherein the third and fourth access transistors are constructed of MOS transistors, and
the method for driving the semiconductor memory device further comprises applying a voltage to the read word line to control the turning on/off of the third and fourth access transistors upon the read operation.

17. The method for driving the semiconductor memory device according to claim 13, further comprising applying a voltage to the first and second read bit lines to forward-bias the third and fourth access transistors upon a write operation.

18. The method for driving the semiconductor memory device according to claim 13, further comprising: upon a retention,
applying a voltage to the write word line to turn off the first and second access transistors;
applying a voltage to the read word line to turn off the third and fourth access transistors;
applying a voltage to the first write bit line to forward-bias the first access transistor;
applying a voltage to the second write bit line to forward-bias the second access transistor;
applying a voltage to the first read bit line to forward-bias the third access transistor; and
applying a voltage to the second read bit line to forward-bias the fourth access transistor.

19. The method for driving the semiconductor memory device according to claim 13, further comprising applying a preset voltage between a power supply voltage on a high potential side and a ground potential to the first and second write bit lines upon a retention.

* * * * *